United States Patent
Jun et al.

(10) Patent No.: US 8,044,750 B2
(45) Date of Patent: Oct. 25, 2011

(54) NANO-RESONATOR INCLUDING BEAM WITH COMPOSITE STRUCTURE

(75) Inventors: Seong Chan Jun, Seoul (KR); Sun Il Kim, Seoul (KR); Chan Wook Baik, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 585 days.

(21) Appl. No.: 12/071,994

(22) Filed: Feb. 28, 2008

(65) Prior Publication Data
US 2008/0297276 A1    Dec. 4, 2008

(30) Foreign Application Priority Data
Jun. 1, 2007   (KR) .................. 10-2007-0053705

(51) Int. Cl.
*H03H 9/24* (2006.01)
(52) U.S. Cl. ........ 333/186; 333/200; 977/712; 977/720; 977/724; 977/932; 257/415; 257/421; 257/E29.104; 257/E29.167
(58) Field of Classification Search ............ 333/186, 333/200; 257/415, 421, E29.104, E29.167; 977/712, 720, 724, 932
See application file for complete search history.

(56) References Cited

U.S. PATENT DOCUMENTS

| | | | | |
|---|---|---|---|---|
| 5,357,108 A * | 10/1994 | Suzuki et al. | ................... | 850/56 |
| 6,544,674 B2 * | 4/2003 | Tuller et al. | ................... | 428/698 |
| 7,202,691 B2 * | 4/2007 | Lagowski et al. | ........ | 324/754.21 |
| 7,352,608 B2 * | 4/2008 | Mohanty et al. | ............. | 365/151 |
| 7,617,736 B2 * | 11/2009 | Tang et al. | ....................... | 73/777 |
| 2008/0204152 A1 * | 8/2008 | Feng et al. | ....................... | 331/34 |

OTHER PUBLICATIONS

X.M.H. Huang et al.; "Quality Factor Issues in Silicon Carbide Nanomechanical Resonators"; Transducers '03, The 12th International Conference on Solid State Sensors, Actuators and Microsystems, Boston, Jun. 8-12, 2003; pp. 722-725.*
S.C. Jun et al.; "Evaluation of 3C-SiC Nanomechanical Resonators Using Room Temperature Magnetomotive Transduction"; Sensors, 2005 IEEE; Oct. 30-Nov. 3, 2005; pp. 1042-1045.*
S.C. Jun et al.; "Electrothermal Frequency Tuning of a Nano-Resonator"; Electronics Letters Dec. 7, 2006, vol. 42, No. 25.*
X.M.H. Huang et al.; "Free-Free Beam Silicon Carbide Nanomechanical Resonators"; Transducers '03, The 12th International Conference on Solid State Sensors, Actuators and Microsystems, Boston, Jun. 8-12, 2003; pp. 342-343.*
Y.T. Yang et al.; "Monocrystalline Silicon Carbide Nanoelectromechaninical Systems"; Applied Physics Letters, vol. 78, No. 2, Jan. 8, 2001, pp. 162-164.*
K. Brueckner et al., *Electromechanical Resonances of SiC and AlN Beams Under Ambient Conditions.*, 585-588, (2005).

* cited by examiner

Primary Examiner — Barbara Summons
(74) Attorney, Agent, or Firm — Harness, Dickey & Pierce, P.L.C.

(57) ABSTRACT

A nano-resonator including a beam having a composite structure may include a silicon carbide beam and/or a metal conductor. The metal conductor may be vapor-deposited on the silicon carbide beam. The metal conductor may have a density lower than a density of the silicon carbide beam.

13 Claims, 7 Drawing Sheets

NANO-RESONATOR INCLUDING BEAM WITH COMPOSITE STRUCTURE

PRIORITY STATEMENT

This application claims the benefit of priority to Korean Patent Application No. 10-2007-0053705, filed on Jun. 1, 2007, in the Korean Intellectual Property Office, the entire contents of which are incorporated herein in their entirety by reference.

BACKGROUND

1. Field

Example embodiments relate to a nano electromechanical system, and for example, to a nano-resonator including a beam with a composite structure.

2. Description of Related Art

A conventional micro electromechanical system (MEMS) includes a sensor for detecting various physical or chemical properties. As a dimension of a mechanical transducer is reduced, a new generation system having improved sensitivity, spatial resolution, energy efficiency, and reaction time, which is referred to as a nano electromechanical system (NEMS), has been developed.

For an apparatus in the communications field, a higher favorability, i.e., a higher Q (quality factor) value, is desired, so that a mechanical device may be used in an electronic device, e.g., in a SAW or a Film Bulk Acoustic Resonator FBAR. In the electronic device, frequency tuning may not operate structurally, and a next generation mechanism having a nano-mechanical resonator is needed.

In the case of a mechanical vibration, a resonant frequency $f_o$ may be expressed as $$f_o = \frac{1}{2\pi}\sqrt{\frac{k_r}{m_r}},$$

where $k_r$ is a spring constant and $m_r$ is mass. The spring constant $k_r$ is inversely proportional to a length of a beam and increases in proportion to width and thickness of the beam. The mass $m_r$ is a product of a volume and a density (mass/volume) of the beam and is proportional to a magnitude of the entire beam.

In relatively colder temperatures, a trial performance of a conventional nano-resonator of a nano size at a level of giga-hertz (GHz) was performed. However, a conventional nano-resonator has technical problems at room temperature and atmospheric pressure, and in a normal magnetic field, i.e., in non-superconductivity.

In order to solve the technical problems of a conventional nano-resonator and to realize a practical application of the conventional nano-resonator at room temperature and atmospheric pressure, and in a non-superconductive magnetic field, a nano-beam of double or multiple structure has been suggested. If the nano-resonator is used as a communication apparatus (for example, as a filter and oscillator) in a higher frequency region (i.e., gigahertz (GHz) or more), Young's Modulus and stiffness of larger values are required. GaAs, Si and SiC are NEMS materials having values which meet the requirements of Young's Modulus and stiffness of larger values. For example, SiC has a larger value and a stability of SiC is recognized. However, vapor deposition of SiC is more difficult, and a limitation value for SiC is up to 30 nm. Due to the electrical conductivity of SiC, signal detection may be made only in a chamber of liquid He having a relatively lower temperature and a relatively lower pressure. The signal detection may be made only under superconductive magnetic force lines (e.g., up to 8 T).

Accordingly, a conventional nano-resonator has a lower electrical conductivity and requires a chamber having relatively lower temperature, relatively lower pressure, and superconductive magnetic force lines. Therefore, the conventional nano-resonator may not be used at room temperature and atmospheric pressure or in a non-superconductive magnetic field. The conventional nano-resonator is more difficult to operate in the higher-frequency region of giga-hertz (GHz) or more.

SUMMARY

Example embodiments may provide a nano-resonator including a beam with a composite structure, which may increase an electrical conductivity of a nano-beam, need not require superconductive magnetic force lines, may sufficiently resonate even at a more moderate vacuum condition, may increase a favorability, and/or may more easily operate in a higher-frequency region of giga-hertz or more.

According to an example embodiment, a nano-resonator may include a beam with a composite structure may include a silicon carbide beam and/or a metal conductor. The metal conductor may be vapor-deposited on the sacrificial layer. The metal conductor may have a density lower than a density of the silicon carbide beam.

According to an example embodiment, the nano-resonator may include a sacrificial layer vapor deposited on the silicon carbide beam and interposed between the silicon carbide beam and the metal conductor.

According to an example embodiment, the nano-resonator may include a sandwich structured beam on a silicon wafer and/or a network analyzer. The sandwich structured beam may generate a mechanical vibration depending on a magnetomotive field and an alternating current. The network analyzer may apply the alternating current to both ends of the sandwich structured beam and/or detect a voltage corresponding to the mechanical vibration of the sandwich structured beam. The sandwich structured beam may include the silicon carbide beam, the metal conductor, and/or the sacrificial layer.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

In order to maintain a desired, or alternatively, a predetermined electrical conductivity and/or a desired, or alternatively, a predetermined favorability (i.e., Q quality factor value), a beam material for a beam included in a nano-resonator may need to be modified. In order to use silicon carbide at a higher frequency, the conductivity of the silicon carbide may need to be increased. However, a method of diffusing metal with silicon carbide has not been developed.

Therefore, according to example embodiments, conductivity of a beam may be maintained while maintaining the characteristic of the higher frequency of the beam by vapor-depositing a metal having a lower density than a silicon carbide resonator of the beam so that the beam may endure a higher vibration.

Figure 1:
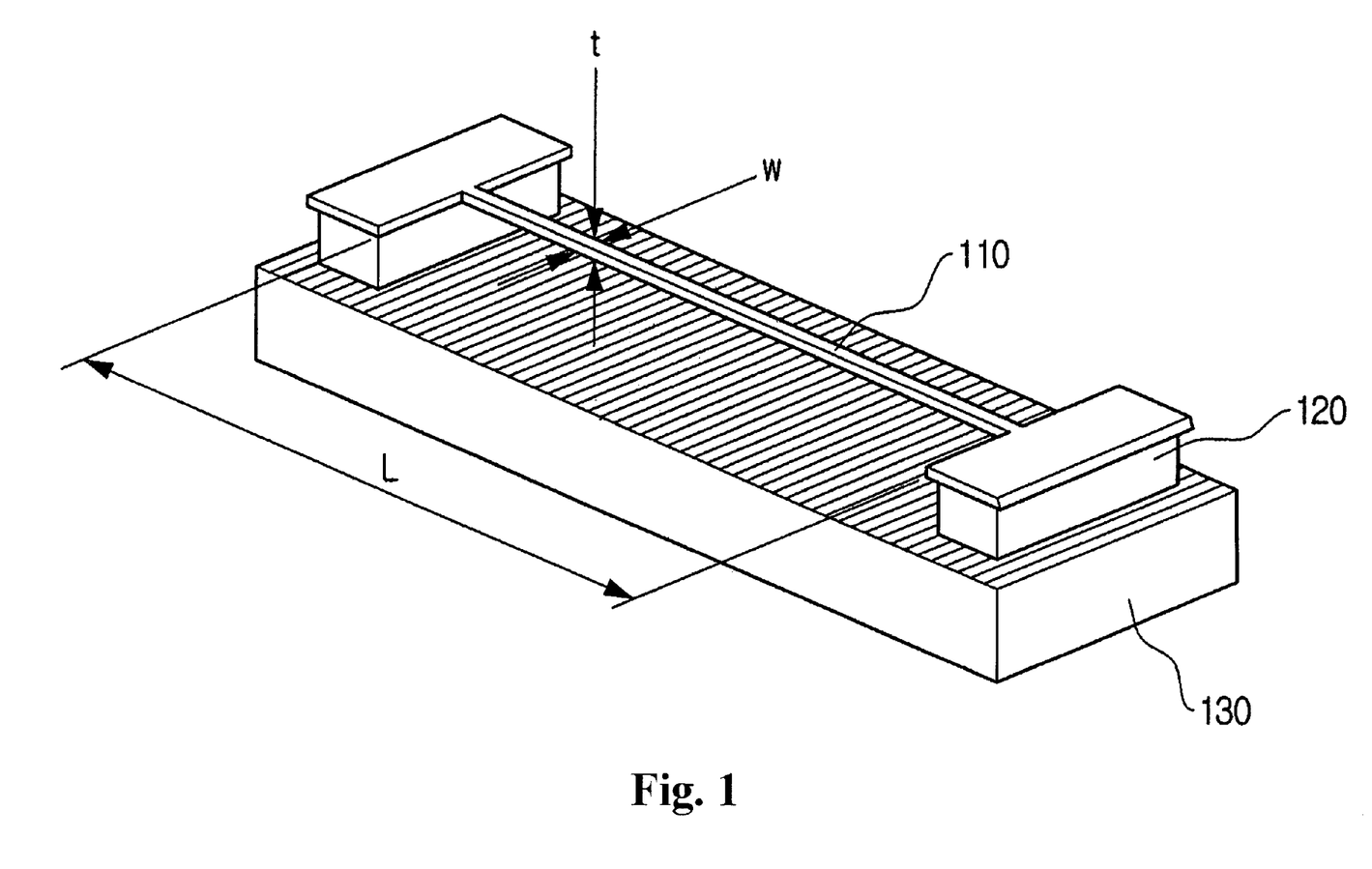
FIG. 1 shows a structure of a nano-resonator including a beam with a composite structure according to an example embodiment.

FIG. 1 shows a structure of a nano-resonator including a beam with a composite structure according to an example embodiment.

Referring to FIG. 1, AC voltage may be applied to both ends 120 of a beam 110. The beam 110 may be a nano-beam. If B field force is directed up from a bottom surface 130, the beam may vibrate from side to side in parallel to a plane of the beam due to Lorentz force. An inherent vibration frequency of the beam may be determined by the material properties and geometrical structure of the beam. An effective stress on the beam may be determined by stress that is applied depending on manufacturing characteristics of the beam. In other words, the effective stress may determine a real resonant frequency of the beam.

Figure 2:
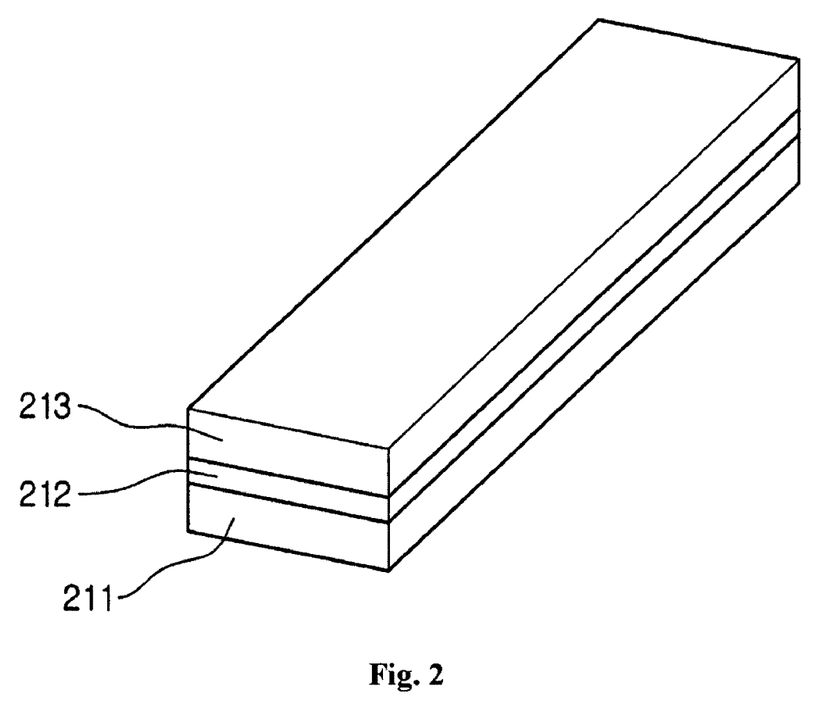
FIG. 2 shows a detailed structure of a beam with a composite structure that may be included in the nano-resonator in FIG. 1.

FIG. 2 shows a detailed structure of a beam with a composite structure that may be included in the nano-resonator in FIG. 1.

According to an example embodiment, a sandwich structured beam may include a support layer, e.g., a metal layer 213, may be vapor-deposited on a silicon carbide resonator 211 having higher-frequency characteristics. The metal layer 213 may have a lower density than a density of the silicon carbide resonator 211. A sacrificial layer 212 may be interposed between the metal layer 213 and the silicon carbide resonator 211. The sacrificial layer 212 may provide a stronger connection between the metal layer 213 and the silicon carbide resonator 211 that may endure higher frequency vibration. The metal layer 213 may include all conductors, including metals having lower density.

The beam 110 having a composite structure as shown in FIG. 2 according to an example embodiment may include the silicon carbide beam 211, the sacrificial layer 212, which may be vapor-deposited on the silicon carbide beam forming the silicon carbide resonator 211, and/or the metal layer 213, which may have a lower density than the silicon carbide beam 211 and/or may be vapor-deposited on the sacrificial layer 212.

For a high frequency vibration of the beam 110 in more practical conditions, for example about room temperature, about a 1 Torr vacuum and about a 0.7 T B field, a material having a better conductivity than the silicon carbide resonator 211 and a lower density than the silicon carbide resonator 211 may need to be vapor-deposited on the sacrificial layer 212 to form the metal layer 213. Aluminum (Al), gold (Au) and/or copper (Cu) are examples of a material which may be deposited on the sacrificial layer 212 to form the metal layer 213. However, example embodiments are not limited thereto, and any conductor may be deposited on the sacrificial layer 212 to form the metal layer 213. However, if copper is used as the metal conductor in forming the metal layer 213, the sacrificial layer 212 may be omitted.

If aluminum is included in the metal layer 213, the sacrificial layer may include chromium. If the metal layer 213 includes aluminum, an oxide layer may be vapor-deposited on the metal layer 213, thereby reducing oxidation, prolonging the lifespan, increasing a hardness, and/or increasing a frequency region of the beam 110.

A stronger vapor-deposition that may endure a higher frequency resonance may be required. In other words, the beam 110 may need to have better mechanical stiffness and/or better endurance against an external force even if an aspect ratio is higher, and/or the beam 110 may need to mechanically endure a vibration occurring if a resonance vibration is generated.

Accordingly, the sacrificial layer 212 may be interposed between the two materials of the silicon carbide resonator 211 and the metal layer 213. For example, chromium may be applied as the sacrificial layer 212. However, a type of the sacrificial layer 212 may be different depending on a type of the conductor included in the metal layer 213.

Figure 3A:
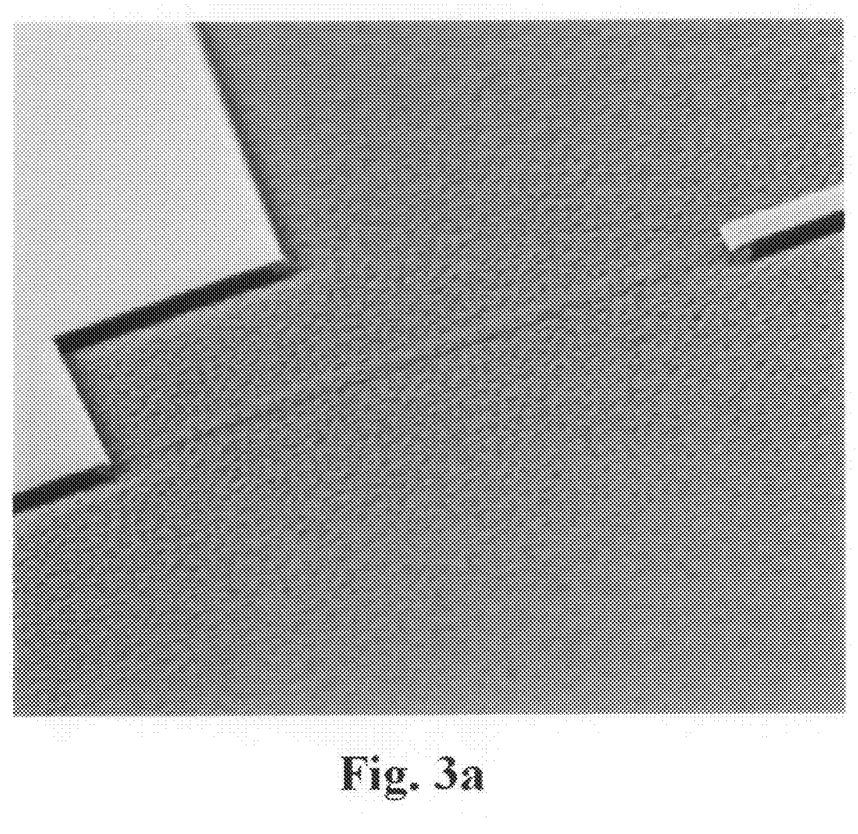
FIG. 3a is a photograph of an example nano-resonator according to an example embodiment.
Figure 3B:
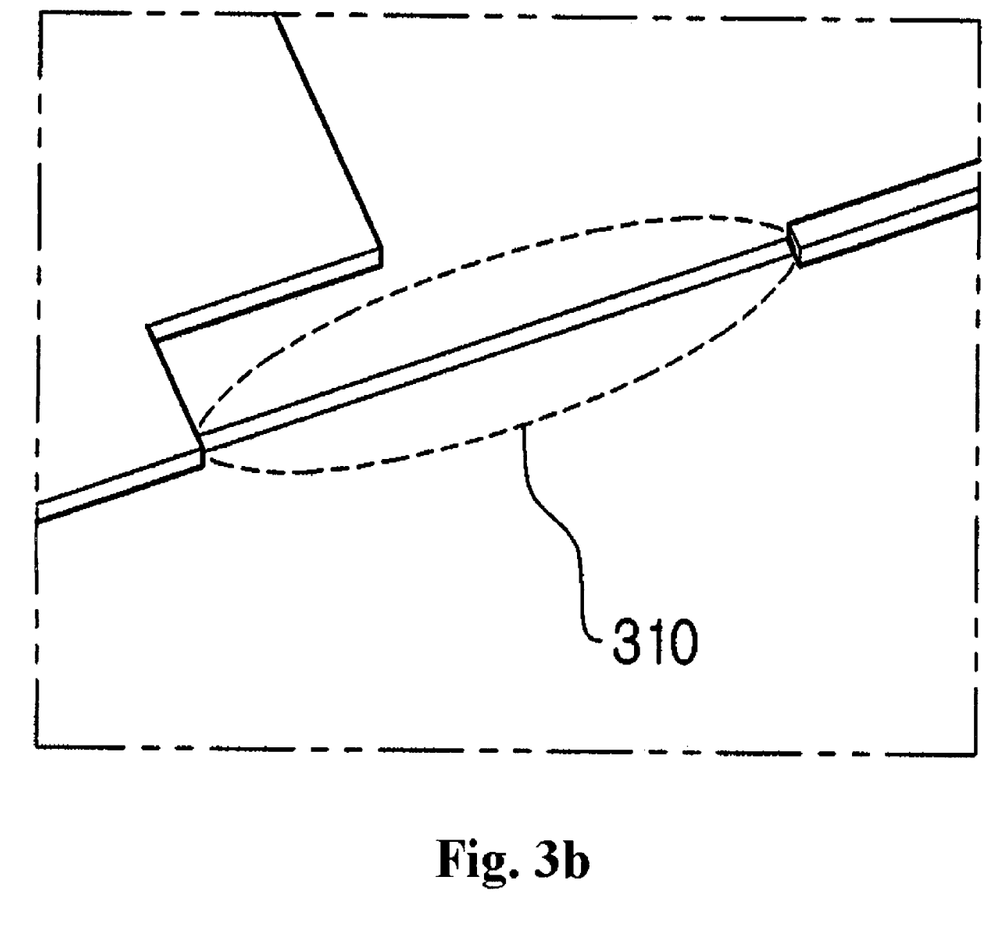
FIG. 3b is an example illustration of the example nano-resonator of the photograph in FIG. 3b.

FIG. 3a is a photograph of an example nano-resonator according to an example embodiment. The photographed, example nano-resonator is provided in a chamber that forms a relatively moderate vacuum. FIG. 3b is an example illustration which shows more simply the features of the photograph of FIG. 3a. FIG. 3b shows a nano-beam 310 according to an example embodiment.

Figure 4:
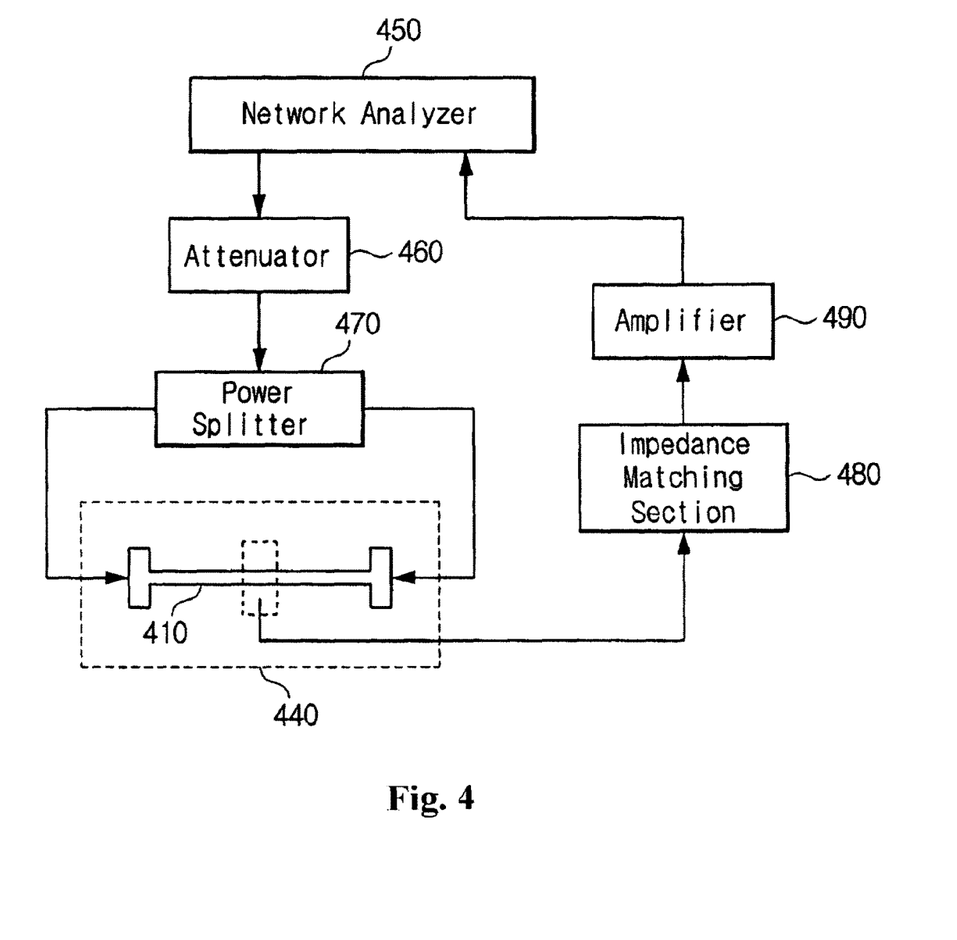
FIG. 4 is a block diagram of a nano-resonator including a beam with a composite structure according to another example embodiment.

FIG. 4 is a block diagram of a nano-resonator including a beam with a composite structure according to another example embodiment.

FIG. 4 shows a circuit diagram of an operating structure for a nano-resonator. A sandwich structured beam 410 may be fixed on a silicon wafer and/or may generate a mechanical vibration depending on a magnetomotive field and an alternating current applied to the sandwich structured beam 140. The sandwich structured beam 410 may include, e.g., as described above with reference to FIG. 2, a silicon carbide beam, a sacrificial layer, which is vapor-deposited on the silicon carbide beam, and/or a metal conductor having a lower density than the silicon carbide beam, which is vapor-deposited on the sacrificial layer. The sandwich structured beam 410 may be provided in a chamber 440 under the conditions of about room temperatures and about 1 Torr pressure.

A network analyzer 450 may apply the alternating current to both ends of the sandwich structured beam 410 using a power splitter 470 and/or may detect a voltage corresponding to a mechanical vibration of the sandwich structured beam 410. The network analyzer 450 may use the detected voltage to measure a resonant frequency generated by the sandwich structured beam 410. A high frequency oscillator may be structured having a voltage signal of the higher frequency that is generated by the sandwich structured beam 410. The sandwich structured beam 410 may be configured as a high frequency oscillator and/or the network analyzer may be configured as a sensor for measuring a resonant frequency. However, example embodiments are not limited thereto, and the network analyzer 450 may be replaced with another constitutional element that may require a voltage signal having a higher frequency.

An attenuator 460 may be connected to an output terminal of the network analyzer 450, and the output terminal may output the alternating current from the network analyzer 450 The attenuator 460 may change an output of the network analyzer 450 into a desired, or alternatively, a predetermined level for the nano-resonator.

An impedance matching section 480 may carry out an impedance matching, thereby reducing a signal-to-noise ratio from the voltage corresponding to the mechanical vibration of the sandwich structured beam 410.

An amplifier 490 having applied direct current (DC) may receive the signal transmitted from the impedance matching section 480 and/or may be connected to a detection terminal of the network analyzer 450 at which the network analyzer 450 detects the voltage. The amplifier 490 may be configured to amplify the signal to be detected.

A length of the nano-beam according to example embodiments may be about ten times or more smaller, as compared to a conventional MEMS and/or a volume of the nano-beam according to example embodiments may be about 100 times or more smaller, as compared to a conventional MEMS. Therefore, a difference of about 100 times to about 1,000 times may exist between the driving power of a nano-resonator including a beam with a composite structure according to example embodiments and the conventional MEMS. A nano-resonator including a beam with a composite structure according to example embodiments may have better accuracy, as compared to a conventional MEMS and/or may have a favorability, e.g., a Q quality factor value, of about 1,000 to 10,000, as compared to a favorability, e.g., a Q quality factor value, of 100 to 2,000 of the conventional MEMS.

Figure 5A:
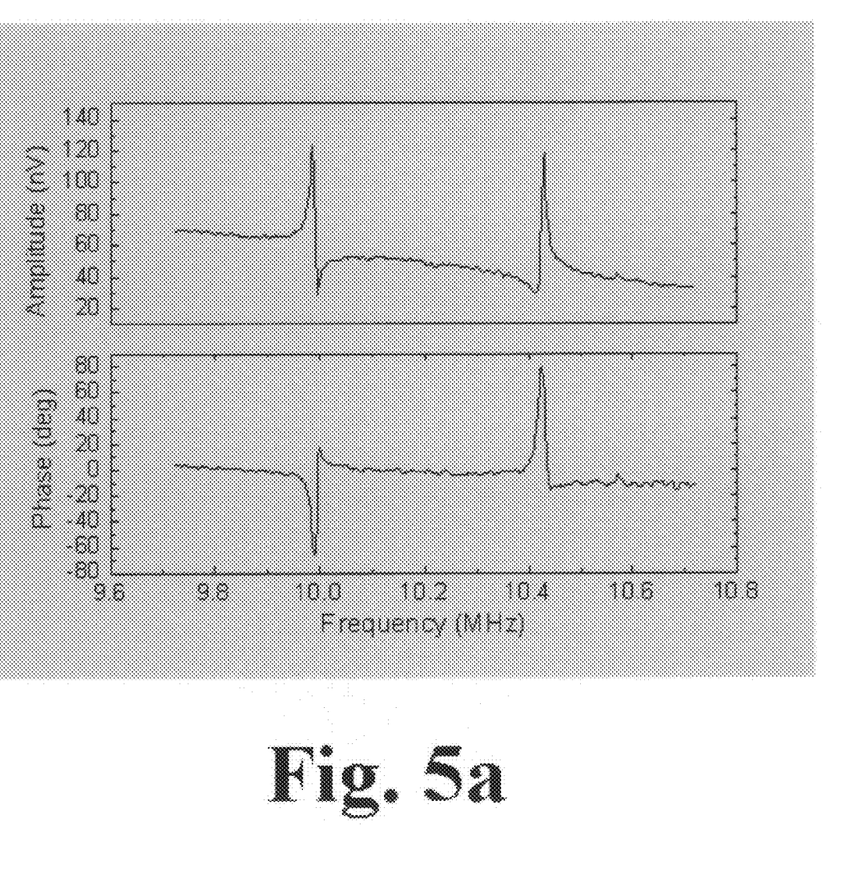
FIGS. 5a and 5b are example graphs showing measurement results of mechanical vibrations in an example nano-resonator including a beam with a composite structure according to an example embodiment.
Figure 5B:
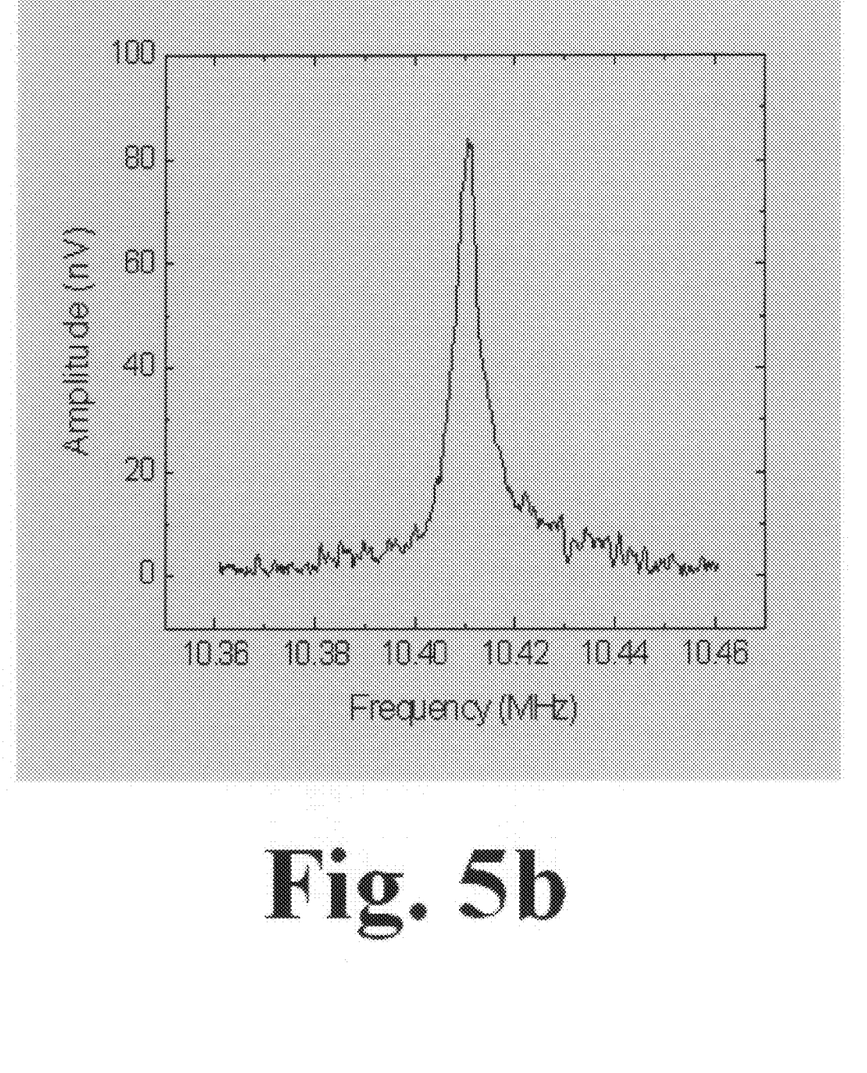

FIGS. 5a and 5b are example graphs showing measurement results of mechanical vibrations in an example nano-resonator including a beam with a composite structure according to an example embodiment. In FIG. 5a, a measurement of the mechanical resonance by a magnetomotive transduction was carried out at conditions of 600 mTorr and room temperature. The magnetic field of 0.9 T applied by a permanent magnet of NdFeB was used to measure the mechanical resonance. In FIG. 5b, in order to secure a linearity of response, the drive was reduced to 3 mV. The graph shows a de-embedded resonance peak. One Lorentz fit shows that the favorability, e.g., the Q quality factor value, of the resonance is approximately 2,800.

According to example embodiments, in order to increase the electrical conductivity of the silicon carbide (SiC) nano-resonator for higher frequency, the conductor of lower density and the sacrificial layer may be vapor-deposited on a conventional silicon carbide beam, in a form of a sandwich structure, so that the higher frequency may be obtained without sacrificing a favorability, e.g., a Q quality factor value.

Higher resonant frequency detection for a conventional nano-resonator may only be performed in a chamber of liquid He at a relatively lower temperature and at relatively lower pressure. The detection for the conventional nano-resonator may only be performed under superconductive magnetic force lines, e.g., up to 8 T. However, a beam structure according to example embodiments may include silicon carbide, thereby enabling the nano-resonator to operate at a higher frequency under conditions of room temperature, a more moderate vacuum, and/or a permanent and non-superconductive magnetic field because a material of lower density than the silicon carbide beam may be vapor-deposited on the surface of the silicon carbide beam to increase an electrical conductivity of the beam, without sacrificing higher frequency detection and/or a Q quality factor value, thereby allowing operation at the higher frequency.

In other words, example embodiments may increase an electrical conductivity without sacrificing the characteristics of the silicon carbide, which is a better material for higher frequency. Accordingly, example embodiments may provide a basis for more practical applications, for example, applications at room temperature, atmospheric pressure, and/or a non-superconductive magnetic field. Therefore, example embodiments may allow for applying the nano-resonator to a sensor, a filter, and/or an oscillator, even at room temperature, atmospheric pressure, and/or using a smaller magnet.

As described above, an electrical conductivity of a nano-beam according to an example embodiment may be increased and/or a sufficient resonance may be achieved under conditions of room temperature and a more moderate vacuum without the superconductivity magnetic line. Accordingly, a practical application of the nano-beam may be more easily made, the favorability may be increased, and/or an operation of the nano-beam in the higher frequency region of giga-hertz or more may be more easily achieved.

Although example embodiments have been shown and described in this specification and figures, it would be appreciated by those skilled in the art that changes may be made to the illustrated and/or described example embodiments without departing from their principles and spirit.

What is claimed is:

1. A nano-resonator including a beam having a composite structure, comprising:
   a silicon carbide beam;
   a metal conductor on the silicon carbide beam, the metal conductor having a density lower than a density of the silicon carbide beam; and
   an oxide layer on the metal conductor.

2. The nano-resonator according to claim 1, wherein the metal conductor includes at least one of aluminum, gold, and copper.

3. The nano-resonator according to claim 1, wherein the metal conductor includes copper.

4. The nano-resonator according to claim 1, wherein the metal conductor includes aluminum.

5. The nano-resonator according to claim 1, further comprising:
   a sacrificial layer on the silicon carbide beam and interposed between the silicon carbide beam and the metal conductor.

6. The nano-resonator according to claim 5, wherein the sacrificial layer includes chromium.

7. The nano-resonator according to claim 5, further comprising:
   a sandwich structured beam on a silicon wafer, the sandwich structured beam configured to generate a mechanical vibration based on a magnetomotive field and an alternating current; and
   a network analyzer configured to apply the alternating current to both ends of the sandwich structured beam and detect a voltage corresponding to the mechanical vibration of the sandwich structured beam,
   wherein the sandwich structured beam includes:
      the silicon carbide beam;
      the metal conductor; and
      the sacrificial layer.

8. The nano-resonator according to claim 7, wherein the metal conductor includes at least one of aluminum, gold, and copper.

9. The nano-resonator according to claim 7, wherein the metal conductor includes aluminum.

10. The nano-resonator according to claim 7, wherein the sacrificial layer includes chromium.

11. The nano-resonator according to claim 7, wherein the sandwich structured beam is provided in a chamber under conditions of about room temperature and about 1 Torr pressure.

12. The nano-resonator according to claim 7, further comprising:
   an impedance matching section configured to carry out an impedance matching to reduce a signal-to-noise ratio from the voltage corresponding to the mechanical vibration of the sandwich structured beam.

13. The nano-resonator according to claim 7, wherein
   the network analyzer is connected at an output terminal to an attenuator, the output terminal of the network analyzer configured to output the alternating current, and
   the network analyzer is connected at a detection terminal to an amplifier, the detection terminal of the network analyzer configured to detect the voltage corresponding to the mechanical vibration of the sandwich structured beam.

* * * * *